United States Patent
Hayashi et al.

(10) Patent No.: US 6,288,323 B1
(45) Date of Patent: Sep. 11, 2001

(54) THIN FILM PHOTOELECTRIC CONVERSION MODULE AND METHOD OF MANUFACTURING THE SAME

(75) Inventors: Katsuhiko Hayashi, Kusatsu; Hideo Yamagishi, Kyotanabe, both of (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/517,218

(22) Filed: Mar. 2, 2000

(30) Foreign Application Priority Data

Aug. 25, 1999 (JP) .................................................. 11-238708
Aug. 25, 1999 (JP) .................................................. 11-238709
Sep. 16, 1999 (JP) .................................................. 11-262214
Sep. 16, 1999 (JP) .................................................. 11-262215

(51) Int. Cl.$^7$ ........................... H01L 31/042; H01L 31/18
(52) U.S. Cl. ........................ 136/244; 136/256; 136/293; 136/255; 438/66; 438/67; 438/74; 438/80; 438/88; 257/443; 257/448; 257/431
(58) Field of Search ..................... 136/244, 256, 136/293, 255; 438/66, 67, 74, 80, 88; 257/443, 448, 431

(56) References Cited

U.S. PATENT DOCUMENTS

| | | | |
|---|---|---|---|
| 4,315,096 | 2/1982 | Tyan et al. | 136/244 |
| 5,089,426 | * 2/1992 | Yamazaki et al. | 136/244 |
| 5,330,584 | * 7/1994 | Saga et al. | 136/255 |
| 5,580,395 | * 12/1996 | Yoshioka et al. | 136/255 |

FOREIGN PATENT DOCUMENTS

| | | | |
|---|---|---|---|
| 749161 | * 12/1996 | (EP) | . |
| 5-110121 | 4/1993 | (JP) | . |
| 8-088392 | 4/1996 | (JP) | . |
| 10-004202 | 1/1998 | (JP) | . |

* cited by examiner

*Primary Examiner*—Alan Diamond
(74) *Attorney, Agent, or Firm*—Hogan & Hartson, L.L.P.

(57) ABSTRACT

The present invention provides a thin film photoelectric conversion module, including a substrate and a plurality of thin film photoelectric conversion cells formed on the substrate and connected to each other in series to form a series-connected array. Where the light to one of the cells is intercepted, the particular cell is prevented from being heated to an excessively high temperature by suppressing the behavior of the cell as a diode through repeatedly applying a reversed bias voltage to each cell, by preventing a large current from flowing through the light-intercepted cell through employing the construction that a plurality of series-connected arrays each having a sufficiently low short-circuit current are connected to each other in parallel or through using a plurality of sub-arrays each having a sufficiently low short-circuit current for forming the series-connected array and connecting bypass diodes to these sub-arrays, respectively, in parallel, or by facilitating occurrence of short-circuiting in the light-intercepted cell through arranging a metal portion that is partly in contact with the thin film photoelectric conversion unit.

20 Claims, 4 Drawing Sheets

THIN FILM PHOTOELECTRIC CONVERSION MODULE AND METHOD OF MANUFACTURING THE SAME

CROSS-REFERENCE TO RELATED APPLICATIONS

This application is based upon and claims the benefit of priority from the prior Japanese Patent Applications No. 11-238708, filed Aug. 25, 1999; No. 11-238709, filed Aug. 25, 1999; No. 11-262214, filed Sep. 16, 1999; and No. 11-262215, filed Sep. 16, 1999; the entire contents of which are incorporated herein by reference.

BACKGROUND OF THE INVENTION

The present invention relates to a thin film photoelectric conversion module and a method of manufacturing the same, particularly, to a thin film photoelectric conversion module having a plurality of thin film photoelectric conversion cells connected in series and a method of manufacturing the same.

In general, a thin film photoelectric conversion module comprises a plurality of band-like thin film photoelectric conversion cells arranged in the direction of the short axis of the cell and connected to each other in series. In general, such a module is not used singly and is used generally in the form of a module array consisting of a plurality of modules connected in series or in parallel.

Where a leaf or bird droppings are attached to the light-receiving surface of a certain thin film photoelectric conversion cell included in such a thin film photoelectric conversion module, the light to the particular cell is partially or entirely intercepted so as to decrease the photoelectromotive force, leading to a marked reduction in the output of the entire module. It should be noted that the cell with the decreased photoelectromotive force acts as a diode connected in series in the reverse direction to the direction of the power generation, i.e., in the reverse direction to the direction in which the current generated by the photoelectric conversion flows. As a result, the light-intercepted cell exhibits a very high resistance, leading to the marked reduction in the output of the entire module as pointed out above.

The decreased photoelectromotive force of the cell affects not only the particular module but also the module array. More specifically, the module including a cell whose photoelectromotive force is decreased causes the output of the module array to be lowered markedly.

A measure for overcoming the problem is disclosed in, for example, Japanese Patent Disclosure (Kokai) No. 57-53986. Specifically, it is disclosed that a plurality of thin film photoelectric conversion cells connected in series are divided into a plurality of series arrays, and that these series arrays are connected in parallel. The particular technique makes it possible to prevent the output of the module array from being lowered markedly even if the photoelectromotive force of any of the cells has become zero. Also, in order to prevent the output of the module array from being lowered markedly, another measure such as mounting a single bypass diode to every module is known.

However, an additional problem is produced by the attachment of, for example, a leaf to the thin film photoelectric conversion cell, as follows. Specifically, if voltage higher than the withstand voltage is applied to the cell having the light thereto intercepted by the attached leaf or the like, an insulation breakdown is generated. Current does not flow uniformly through the cell of the particular state so as to bring about a local heating called a hot spot phenomenon. The local heating does not produce a serious problem where the current flowing through the cell is small. However, a module having a large area generally produces a large output current, with the result that, in the conventional module having a large area, the light-intercepted cell is heated to a very high temperature.

BRIEF SUMMARY OF THE INVENTION

An object of the present invention is to provide a thin film photoelectric conversion module in which, even if the light to one of the thin film photoelectric conversion cells is intercepted, the particular cell is not heated to an excessively high temperature, and a method of manufacturing the particular module.

Another object is to suppress the heating of a thin film photoelectric conversion cell where the light to one of the cells is intercepted so as to prevent the particular cell from being broken.

Still another object of the present invention is to provide a thin film photoelectric conversion module having a high reliability and a method of manufacturing the same.

As a result of an extensive research conducted in an attempt to achieve the objects given above, the present inventors have found that a thin film photoelectric conversion module of a high reliability comprising a plurality of thin film photoelectric conversion cells can be achieved by suppressing the behavior of the cell as a diode, by preventing a large current from flowing through the light-intercepted cell, or by facilitating the formation of a short-circuit in the light-intercepted cell. By employing any of these measures, the cell having the light thereto intercepted can be prevented from being heated to an excessively high temperature.

For example, where the behavior as a diode of the light-intercepted cell is suppressed, the light-intercepted cell is capable of easily permitting a current to flow in the direction equal to the power generating direction. As a result, it is possible to suppress the heat generation within the particular cell or to prevent the cell from being broken. Where a large current is not allowed to flow through the light-intercepted cell, the heat generation in the cell can be suppressed so as to prevent the cell from being broken. Further, where a short-circuit is easily formed within the light-intercepted cell, the short-circuiting can be generated at a relatively low temperature, making it possible to prevent the cell from being heated to an excessively high temperature.

The present inventors have conducted an extensive research in suppressing the behavior of the light-intercepted cell as a diode. As a result, a special phenomenon has been found that, where a reversed bias, i.e., voltage in the forward direction relative to the power generation direction, is applied repeatedly to the thin film photoelectric conversion cell, it is possible to increase the current flowing through the cell on applying a reversed bias voltage while scarcely affecting the fill factor (F.F.). The present inventors considered that, even if light to a certain cell was intercepted, it would be possible to prevent the light-intercepted cell from being heated to an excessively high temperature, to prevent the output of the entire module from being markedly lowered, and to prevent the cell from being broken by utilizing the particular phenomenon pointed out above. These effects have been actually confirmed.

According to a first aspect of the present invention, there is provided a thin film photoelectric conversion module, comprising a substrate; and a series-connected array including a plurality of thin film photoelectric conversion cells formed on the substrate and connected to each other in series, the number of cells being represented by N, an open-circuit voltage of each the cells being represented by E, and N being an integer of at least 10, wherein a current equal to a short-circuit current of each of the cells under conditions that a xenon lamp is used as a light source, an irradiance is 100 mW/cm$^2$, air mass is 1.5, and temperature is 25° C., is allowed to flow through each of the cells by application of a reversed bias voltage not higher than (N−1)×E.

According to a second aspect of the present invention, there is provided a method of manufacturing a thin film photoelectric conversion module including a substrate and a plurality of thin film photoelectric conversion cells formed on the substrate and connected to each other in forward direction, comprising the step of repeatedly applying a reversed bias voltage to each of the cells so as to increase the magnitude of the current flowing through the cells on applying the reversed bias voltage.

In the first aspect of the present invention, the reversed bias voltage is, for example, not higher than 8V.

In the second aspect of the present invention, the cells are generally connected in series to form a series-connected array. In this case, it is desirable to apply repeatedly a reversed bias voltage to each of the cells until each cell attains a predetermined state. Incidentally, the predetermined state denotes the state that, when the reversed bias voltage represented by (N−1)×E, e.g., reversed bias voltage of about 8V, is applied to the cell, the current flowing through the cell is not smaller than the short-circuit current of the series-connected array under the above-noted conditions. Even if the light to one of the cells is intercepted in the module thus obtained, the light-intercepted cell is not heated excessively so as to be broken. Also, in this case, it is desirable to apply repeatedly a reversed bias voltage of 8 v to 9V to each cell.

In the second aspect of the present invention, it is possible to apply repeatedly a reversed bias voltage by utilizing, for example, an AC voltage.

The present inventors have also conducted an extensive research in an attempt to prevent a large current from flowing through the light-intercepted cell. As a result, it has been found that, by employing the construction that a plurality of series-connected arrays are connected in parallel and by designing the short-circuit current of each array at a value not higher a predetermined value, the light-intercepted cell can be prevented from being heated to an excessively high temperature so as to prevent the cell from being broken even where a photoelectromotive force is not generated from one of the thin film photoelectric conversion cells.

To be more specific, according to a third aspect of the present invention, there is provided a thin film photoelectric conversion module, comprising a substrate, a plurality of series-connected arrays each including a plurality of thin film photoelectric conversion cells formed on the substrate and connected in series, and a pair of common electrodes for connecting these plural series-connected arrays in parallel, wherein a short-circuit current of the module is not lower than 1 A under conditions that a xenon lamp is used as a light source, irradiance is 100 mw/cm$^2$, air mass is 1.5, and temperature is 25° C., and a short-circuit current of each of the plural series-connected array is not higher than 600 mA under the above-noted conditions.

In the third aspect of the present invention, these cells are arranged, for example, in both the vertical and lateral directions to form a lattice-like arrangement. In this case, the cells adjacent to each other in the vertical direction are connected in series to form the plural series-connected arrays, and the pair of common electrodes are arranged in both edge portions in the vertical direction of the particular arrangement of the cells.

In the third aspect of the present invention, it is desirable for the short-circuit current of each of the plural series-connected arrays to be not higher than 300 mA under the conditions given above. In this case, the light-intercepted cell is prevented from being heated to an excessively high temperature so as to effectively prevent the cell from being broken.

In preventing a large current from flowing through the light-intercepted cell, the present inventors paid attentions to the fact described below. Specifically, if a series-connected array consisting of an N-number of thin film photoelectric conversion cells connected in series is short-circuited in the case where the light to one of the cells is intercepted, voltage obtained by multiplying the open-circuit voltage $v_b$ of each cell by (N−1) is applied to the light-intercepted cell. In this case, if the voltage (N−1)×V$_b$ is not higher than the withstand voltage V$_a$ of each cell, it is possible to prevent a large current from flowing locally through the cell that has lost its photoelectromotive force. However, the voltage (N−1)×V$_b$ is generally higher than the withstand voltage V$_a$ of each cell.

The present inventors have found that, by dividing the series-connected array into a plurality of sub-arrays and by connecting in parallel a bypass diode to each of these sub-arrays, it is possible to lower the voltage applied to the cell that has lost its photoelectromotive force because of occurrence of the above-noted problem. It has also been found that, if the number $N_s$ of the cells constituting each sub-array meets the relationship $(N_s-1) \times V_b \leq V_a$, it is possible to prevent the cell that has lost its photo-electromotive force from being heated to an excessively high temperature so as to prevent the particular cell from being broken.

To be more specific, according to a fourth aspect of the present invention, there is provided a thin film photoelectric conversion module, comprising a substrate; a plurality of sub-arrays each having a plurality of thin film photoelectric conversion cells formed on the substrate and connected in series, the number of cells constituting each of the plural sub-arrays being represented by $N_s$ and the plural sub-arrays being connected in series to form a series-connected array; and a plurality of bypass diodes connected in parallel to the plural sub-arrays, respectively, wherein the number $N_s$, withstand voltage $V_a$ of each of the cells, and each open-circuit voltage $V_b$ of the cells under conditions that a xenon lamp is used as light source, irradiance is 100 mW/cm$^2$, air mass is 1.5, and temperature is 25° C., meet an inequality $N_s \leq V_a/V_b+1$.

In the fourth aspect of the present invention, each of the plural bypass diodes is, for example, a thin film formed on main surface of the substrate. In this case, each of these bypass diodes may be equal in the layer construction to the cell.

In the fourth aspect of the present invention, it is desirable that the number $N_s$, the withstand voltage $V_a$, and the open-circuit voltage $V_b$ meet an inequality $V_a/V_b-1 \leq N_s$. In this case, the light-intercepted cell is prevented from being heated excessively and, thus, is effectively prevented from being broken.

In facilitating the occurrence of short-circuiting in the light-intercepted cell, the present inventors have paid attentions to the fact described below. Specifically, in a thin film photoelectric conversion cell, a conductive transparent oxide layer is formed in general between the thin film photoelectric conversion unit and the metal back surface electrode layer in an attempt to improve the bonding strength between the two. However, the transparent oxide has in general a melting point higher than that of a metal. Therefore, in the conventional thin film photoelectric conversion cell, the short-circuiting between the metal back surface electrode layer and the transparent front surface electrode layer is obstructed so as to cause the cell to be heated to a very high temperature.

As a result of an extensive research conducted in view of the fact described above, the present inventors have found that, if the metal back surface electrode layer and the thin film photoelectric conversion unit is brought into contact with each other in a part of the region positioned between the metal back surface electrode layer and the transparent front surface electrode layer, it is possible to bring about short-circuiting between the metal back surface electrode layer and the transparent front surface electrode layer instantly a large current flows locally through the cell while maintaining a high bonding strength between the unit and the metal back surface electrode layer. It has also been found that a similar effect can be obtained if a metal portion is arranged in contact with the thin film photoelectric conversion unit in a part of the region interposed between the metal back surface electrode layer and the transparent front surface electrode layer.

To be more specific, according to a fifth aspect of the present invention, there is provided a thin film photoelectric conversion module, comprising a substrate; and a plurality of thin film photoelectric conversion cells formed on the substrate and connected in series, wherein each of the cells comprises a transparent front surface electrode layer, a thin film photoelectric conversion unit provided on the transparent front surface electrode, a conductive transparent oxide layer provided on the unit, a metal back surface electrode layer provided on the transparent oxide layer, and a metal portion that is partly brought into contact with the unit in a region sandwiched between the transparent front surface electrode layer and the metal back surface electrode layer.

In the fifth aspect of the present invention, it is desirable for the contact area between the thin film photoelectric conversion unit and the metal portion to be 0.5 to 10% of a surface area of the unit in the region sandwiched between the transparent front surface electrode layer and the metal back surface electrode layer. In this case, occurrence of the short-circuiting of the light-intercepted cell can be facilitated while scarcely sacrificing, for example, the bonding strength between the thin film photoelectric conversion unit and the metal back surface electrode layer.

Also, in the fifth aspect of the present invention, the metal portion can be arranged such that the metal portion is in contact with the back surface of the thin film photoelectric conversion unit and that the metal portion communicates with both the unit and the metal back surface electrode layer. In this case, the metal portion can be formed of the same material as that constituting the metal back surface electrode layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will now be described in detail with reference to the accompanying drawings. Throughout the drawings, the same reference numerals are put to the same members of the apparatus for avoiding an overlapping description.

Figure 1:
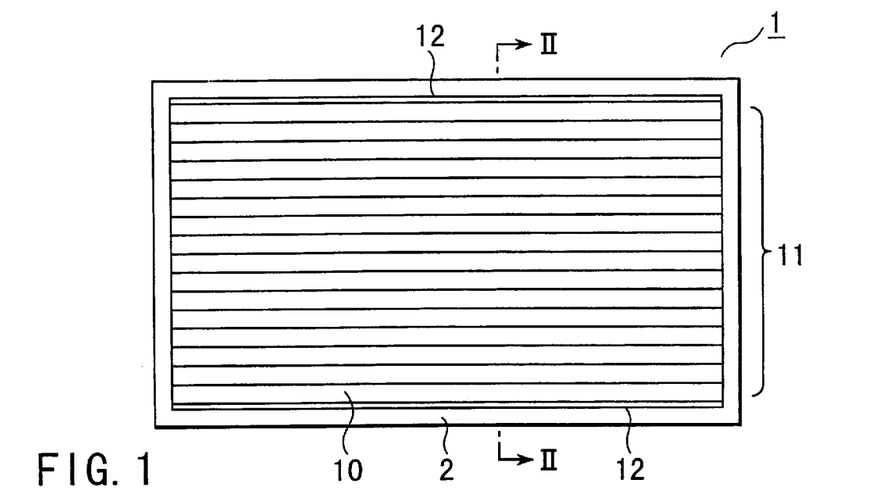
FIG. 1 is a plan view schematically showing a thin film photoelectric conversion module according to a first embodiment of the present invention.

FIG. 1 is a plan view schematically showing a thin film photoelectric conversion module 1 according to a first embodiment of the present invention. As shown in the drawing, the module 1 comprises a transparent substrate 2 and band-like thin film photoelectric conversion cells 10 arranged on the substrate 2. These thin film photoelectric conversion cells 10 are connected to each other in series in the direction of the short axis of the cell 10 to form a series-connected array 11. A pair of electrode bus bars 12 each consisting of a ribbon-like copper foil or the like are connected as common electrodes to both ends of the series-connected array 11.

Figure 2:
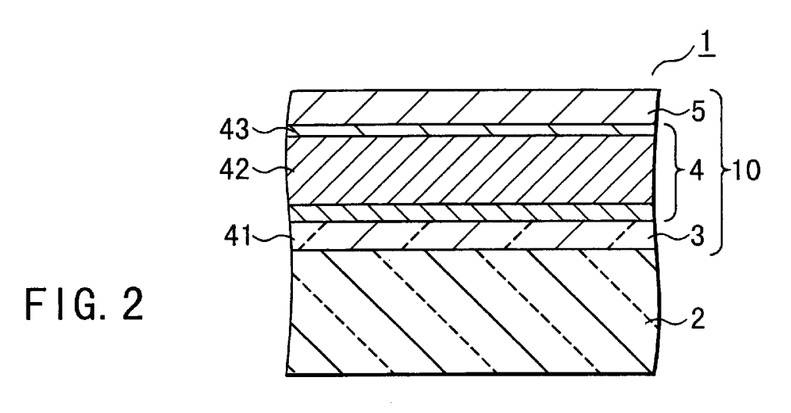
FIG. 2 is a cross sectional view along the line II—II shown in FIG. 1.

FIG. 2, which is a cross sectional view along the line II—II shown in FIG. 1, shows in detail the construction of the module 1 shown in FIG. 1. Only a part of the module 1 is depicted in FIG. 2.

As shown in FIG. 2, the cell 10 of the module 1 comprises the transparent substrate 2. Laminated on the substrate 2 are a transparent front surface electrode layer 3, a thin film photoelectric conversion unit 4 and a metal back surface electrode layer 5. In this module 1, the light incident on the transparent substrate 2 is subjected to a photoelectric conversion by the photoelectric conversion unit 4.

In module 1 shown in FIGS. 1 and 2, the transparent substrate 2 can be formed of, for example, a glass plate or a transparent resin film.

The transparent front surface electrode layer 3 formed on the transparent substrate 2 can be formed of an ITO film, an $SnO_2$ film or a transparent conductive oxide film such as a ZnO film. The electrode layer 3 may be of a single layer structure or a multi-layer structure, and can be formed by a gaseous phase deposition method known to the art such as a vacuum vapor deposition method, a CVD method, and a sputtering method.

It is desirable for the transparent front surface electrode layer 3 to have a surface texture structure having a fine irregularity. The particular surface structure of the electrode layer 3 permits improving the incident efficiency of the light on the photoelectric conversion unit 4.

The thin film photoelectric conversion unit 4 formed on the transparent front surface electrode layer 3 is of a laminate structure consisting, for example, of a p-type non-single crystalline silicon-based semiconductor layer 41, a non-single crystalline thin film photoelectric conversion layer 42 and an n-type non-single crystalline silicon-based semiconductor layer 43 as shown in FIG. 2. Each of these p-type semiconductor layer 41, photoelectric conversion layer 42 and n-type semiconductor layer 43 can be formed by a plasma CVD method.

The p-type silicon-based semiconductor layer 41 can be formed by doping silicon or a silicon alloy such as silicon carbide and silicon-germanium with a p-type impurity such as boron or aluminum.

The photoelectric conversion layer 42 positioned on the p-type semiconductor layer 41 is formed of a non-single crystalline silicon-based material including, for example, an intrinsic silicon semiconductor such as a hydrogenated silicon, a silicon alloy such as silicon carbide and silicon-germanium. It is also possible to use a weakly p-type or weakly n-type silicon-based semiconductor material containing traces of a dopant for determining the conductivity type as far as the photoelectric conversing function is sufficiently performed.

The n-type silicon-based semiconductor layer 43 positioned on the photoelectric conversion layer 42 is formed by doping silicon, a silicon alloy such as silicon carbide and silicon-germanium with an impurity for determining the n-type conductivity such as phosphorus or nitrogen.

The metal back surface electrode layer 5 formed on the photoelectric conversion unit 4 functions as an electrode and as a reflecting layer for reflecting the light incident from the transparent substrate 2 on the photoelectric conversion unit 4 to permit the reflected light to be incident again on the photoelectric conversion unit 4. The metal back surface electrode layer 5, which consists of, for example, silver, can be formed by a vacuum vapor deposition method, a sputtering method, etc.

In general, a transparent oxide layer (not shown) consisting of a conductive transparent oxide such as ZnO is formed between the metal back surface electrode layer 5 and the photoelectric conversion unit 4 in order to improve the bonding strength between the two.

The transparent oxide layer, which generally has a thickness of 50 nm to 150 nm, can be formed by, for example, a sputtering method.

The transparent front surface electrode layer 3 is formed first in the form a sheet and, then, divided by a laser scribing using, for example, a YAG laser. Then, the thin film photoelectric conversion unit 4 is formed in the form of a sheet on the electrode layer 3, followed by dividing the photoelectric conversion unit 4 by the laser scribing. Further, the metal back surface electrode layer 5 is formed in the form of a sheet on the photoelectric conversion unit 4, followed by dividing the electrode layer 5 by the laser scribing. As a result, formed are the plural thin film photoelectric conversion cells 10 connected in series as shown in FIG. 1. In this embodiment, a reversed bias voltage is repeatedly applied to these thin film photoelectric conversion cells 10.

Figure 3A:
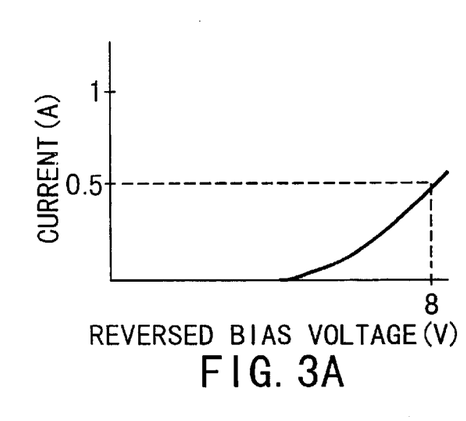
FIG. 3A is a graph showing the electrical characteristics before the reversed bias treatment of the thin film photoelectric conversion module according to the first embodiment of the present invention.
Figure 3B:
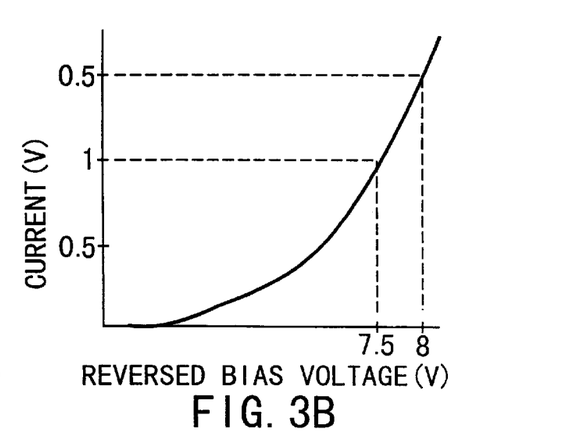
FIG. 3B is a graph showing the electrical characteristics after the reversed bias treatment of the thin film photoelectric conversion module according to the first embodiment of the present invention.

Each of FIGS. 3A and 3B is a graph showing the relationship between the reversed bias voltage applied to the photoelectric conversion cell 10 and the current flowing through the cell 10. FIG. 3A covers the state before a reversed bias voltage is repeatedly applied to the cell 10, with FIG. 3B covering the state after a reversed bias voltage is repeatedly applied to the cell 10. In the graph of each of FIGS. 3A and 3B, a reversed bias voltage applied to the cell 10 is plotted on the abscissa. Also, the current flowing through the cell 10 is plotted on the ordinate.

As apparent from FIGS. 3A and 3B, the current flowing through the cell 10 is increased, if a reversed bias voltage is repeatedly applied to the cell 10. In other words, the resistance is decreased when the light to the cell 10 is intercepted. It follows that the particular treatment makes it possible to prevent the output of the module 1 from being lowered markedly even if the light to one of the cells 10 is completely intercepted. Also, if a reversed bias voltage is applied repeatedly to the cell 10, the current is allowed to flow relatively uniformly when the light to the cell 10 is intercepted. As a result, the local heating within the cell 10 is suppressed so as to prevent the cell 10 from being broken on the basis of the hot spot phenomenon. The effect produced by the reversed bias treatment can be obtained without sacrificing the F.F. characteristics of the cell 10. It follows that the reversed bias treatment employed in the present invention makes it possible to achieve good F.F. characteristics and a high reliability simultaneously.

The resistance of the cell 10 when the light to the cell 10 is intercepted is decreased in general with increase in the number of times of applying the reversed bias voltage, finally reaching a saturation. The aimed resistance differs depending on the construction of the module 1. Where the series-connected array 11 consists of an N-number of cells 10, N being an integer of at least 10, and the open-circuit voltage of the cell 10 under the conditions given below is E, it suffices to apply a reversed bias voltage repeatedly until the current at the time when a reversed bias voltage of $(N-1) \times E$ is applied to each of the thin film photoelectric conversion cells 10 is increased to exceed a short-circuit current of the series-connected array 11 under the conditions given below:

Light source: xenon lamp
irradiance: 100 mW/cm$^2$
A.M.: 1.5
temperature: 25° C.

For example, where the open-circuit voltage of each of the cells 10 under the conditions given above is 0.8V to 0.9V and the series-connected array 11 consists of 10 thin film photoelectric conversion cells 10 connected in series, it suffices to apply a reversed bias voltage repeatedly until the current at the time when a reversed bias voltage of 8V is applied to each of the thin film photoelectric conversion cells 10 is increased to exceed the short-circuit current of the series-connected array 11 under the conditions given above.

It is desirable to apply the reversed bias treatment to the module 1 having the series-connected array 11 consisting of a large number of thin film photoelectric conversion cells 10, for example at least 20 cells 10. In such a module, a higher reversed bias voltage is applied to a cell 10 where the light to the cell 10 is intercepted, and therefore the cell 10 is easy to be broken. It follows that the reversed bias treatment is more effective when applied to such a module.

It is also desirable to continue to apply the reversed bias treatment until each cell permits the current equal to the short-circuit current under the above-noted conditions of the series-connected array to flow in the direction equal to the power generation direction with a lower reversed bias voltage, e.g., a reversed bias voltage not higher than 7V. In this case, the reliability of the module 1 can be further improved without fail.

The reversed bias voltage applied repeatedly to the cell 10 should be set to fall within a range within which the cell 10 is not broken and the resistance of the light-intercepted cell can be decreased. The particular range, which differs depending on the construction, etc. of the cell 10, covers generally 8V to 9V.

The reversed bias voltage can be applied to the cell 10 by bringing a pair of conductive portions connected to a power source into contact with the metal back surface electrode layers 5 of the adjacent cells 10. The transparent front surface electrode layer 3 in one cell 10 is electrically connected to the metal back surface electrode layer 5 of the adjacent cell 10 and, thus, these electrode layers 3 and 5 have the same potential. Therefore, a reversed bias voltage can be applied to the one cell 10 by the method described above.

It is also possible to apply repeatedly a reversed bias voltage to the cell 10 by utilizing an AC voltage. For example, it suffices to superpose an AC voltage on a DC voltage so as to change the voltage periodically between 0V and a predetermined voltage.

It should be noted that the cell 10 is generally formed band-like and, thus, voltage is likely to be applied nonuniformly. In such a case, it is possible for the metal back surface electrode layer 5 to be broken locally. Such being the situation, it is desirable to apply voltage from, for example, a plurality of points to the metal back surface electrode layer 5 so as to prevent the voltage from being applied nonuniformly to the cell 10.

In the module 1 described above, an organic protective layer (not shown) is mounted in general to the back surface with a sealing resin layer (not shown) interposed therebetween. The sealing resin layer serves to seal each thin film photoelectric conversion cell 10 formed on the transparent substrate 2 and is formed of a resin capable of allowing the organic protective film to be bonded to the cell 10. Such a resin includes, for example, a thermoplastic resin, a thermosetting resin and a photo-setting resin. To be more specific, the resin used for forming the sealing resin layer includes, for example, EVA (ethylene-vinyl acetate copolymer), PVB (polyvinyl butyral), PIB (polyisobutylene), and a silicone resin.

The organic protective film consists of an insulating film excellent in humidity resistance and water resistance. For example, a fluorine-containing resin film such as a polyvinyl fluoride film including a Tedler film (registered trade name) or a PET film can be used as the organic protective film. The organic protective film may be of a single layer structure or a laminate structure consisting of a plurality of single layers laminated one upon the other. It is also possible for a metal foil such as an aluminum foil to be sandwiched between two organic protective films. Since the metal foil such as an aluminum foil permits improving the humidity resistance and water resistance, the organic protective film of the particular structure protects more effectively the thin film photoelectric conversion cell 10 from water.

These sealing resin layer and organic protective film can be attached simultaneously to the back surface of the thin film photoelectric conversion module 1 by a vacuum laminate method.

Figure 4:
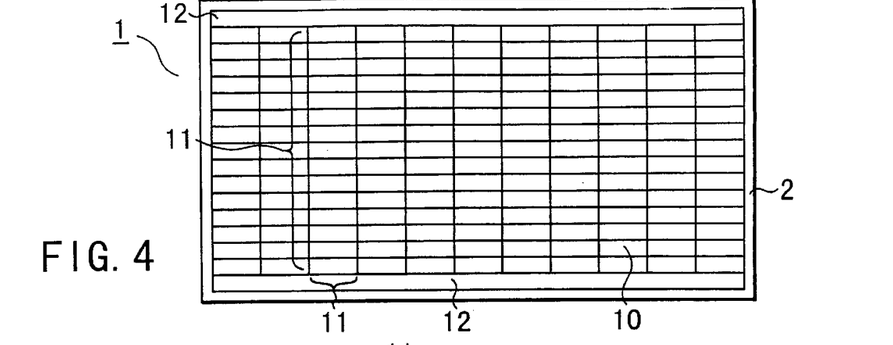
FIG. 4 is a plan view schematically showing a thin film photoelectric conversion module according to a second embodiment of the present invention.

A second embodiment of the present invention will now be described with reference to FIG. 4, which is a plan view schematically showing a module according to the second embodiment of the present invention. The module 1 shown in FIG. 4 is substantially equal in construction to the module 1 shown in FIG. 1, except that the module shown in FIG. 1 has a single series-connected array, whereas, the module shown in FIG. 4 has a plurality of series-connected arrays that are connected in parallel. Therefore, only the difference from the first embodiment will be described concerning the second embodiment.

In FIG. 4, the cells 10 are connected in series in the vertical direction to form a plurality of series-connected arrays 11. These series-connected arrays 11 are connected in parallel by a pair of electrode bus bars 12 acting as common electrodes and each formed of a ribbon-like copper foil or the like. In the module 1 having the parallel structure, even if the light to any of the cells 10 is intercepted to lower the photoelectromotive force, the output of the module 1 is not lowered so much as in a module having a single series-connected structure.

In the second embodiment, each of the series-connected arrays 11 is designed to permit the short-circuit current not to exceed 600 mA under the conditions that a xenon lamp is used as a light source, the irradiance is set at 100 mW/cm$^2$, A.M. (air mass) is set at 1.5, and the temperature is 25° C. In this case, the module 1 is not heated so much as to melt the metal back surface electrode layer 5 of the cell 10 even if the photoelectromotive force of any of the cells 10 is lowered to zero. Thus, the cell 10 is prevented from being broken.

It is desirable for the short-circuit current of the series-connected array 11 under the conditions given above to be not larger than 300 mA, preferably not larger than 200 mA. With decrease in the short-circuit current of the series-connected array 11, the cell 10 can be prevented from being broken more effectively.

The above-noted effect produced by the second embodiment of the present invention is rendered particularly prominent under the conditions that the module 1 is heated to a high temperature when the hot spot phenomenon has taken place, i.e., in the case where the short-circuit current of the module 1 is large. It follows that the second embodiment is effective in the case where the short-circuit current of the module 1 under the conditions given above is not smaller than 1 A, particularly, not smaller than 1.2 A.

Likewise, the above-noted effect is rendered particularly prominent under the conditions in which the hot spot phenomenon is likely to be generated, i.e., in the case where the open-circuit voltage of the series-connected array 11 is high. Therefore, the second embodiment is advantageous in the case where the open-circuit voltage of the series-connected array 11 under the conditions given above is not lower than 10V or in the case where the series-connected array 11 consists of at least 12 cells 10.

The length of the cell 10 in a direction perpendicular to the common electrode 12, which is determined on the basis of the output characteristics required for the module 1, falls within a range of, for example, between 300 mm and 1,000 mm. Also, the length of the thin film photoelectric conversion cell 10 in a direction parallel to the common electrode 12, which is determined on the basis of the short-circuit current of the individual series-connected arrays 11, can be set not to exceed, for example, 400 mm so as to permit the short-circuit current of the individual series-connected arrays 11 to fall within the range noted above. Incidentally, it is desirable for the length of the cell 10 in a direction parallel to the common electrode 12 to be not smaller than 150 mm. Where the cell 10 is excessively diminished, much time is required for the dividing step for obtaining the cell 10. In addition, the area effective for the photoelectric conversion is diminished.

A third embodiment of the present invention will now be described with reference to FIG. 5, which is a plan view schematically showing the module 1 according to the third embodiment of the present invention. The module 1 shown in FIG. 5 comprises a plurality of series-connected arrays 11 that are connected in parallel as in the module 1 shown in FIG. 4. However, the module 1 in the third embodiment differs from the module 1 in the second embodiment in, for example, the shape of the common electrode 12. Only the difference from the second embodiment will be described concerning the third embodiment.

Figure 5:
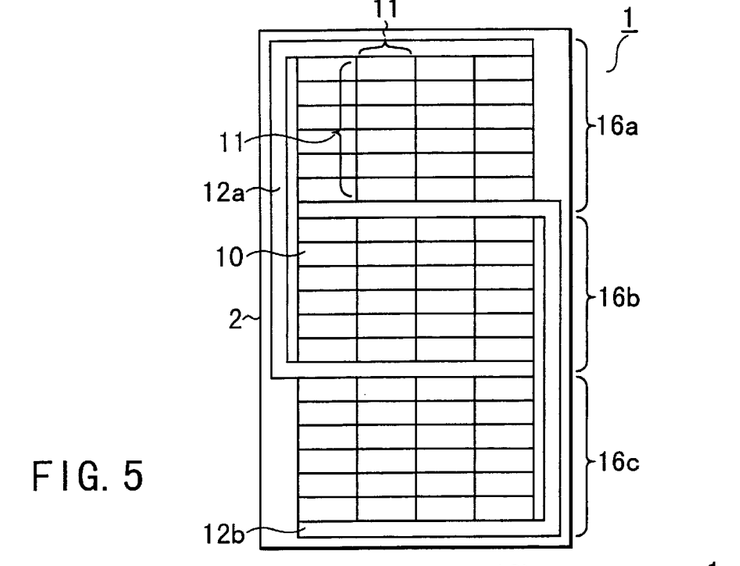
FIG. 5 is a plan view schematically showing a thin film photoelectric conversion module according to a third embodiment of the present invention.

The module 1 shown in FIG. 5 comprises mainly three regions 16a to 16c. In each of the regions 16a to 16c, a plurality of series-connected arrays 11 are connected in parallel by common electrodes 12a and 12b. Also, the common electrodes 12a and 12b are commonly used for all the regions 16a to 16c. In other words, in the module 1 shown in FIG. 5, all the series-connected arrays 11 included in regions 16a to 16c are connected in parallel.

In the module 1 shown in FIG. 5, the number of cells 10 constituting each series-connected array 11 can be decreased without markedly changing the size of the cell 10, compared with the module shown in FIG. 4. Therefore, the module 1 shown in FIG. 5 is particularly useful in the case where a low voltage output is desired.

A fourth embodiment of the present invention will now be described with reference to FIG. 6, which is a plan view schematically showing a module 1 according to the fourth embodiment of the present invention. The module 1 shown in FIG. 6, which is substantially equal in construction to the module 1 of the first embodiment shown in FIG. 1, differs from the module shown in FIG. 1 in that the module 1 shown in FIG. 5 comprises diodes 15a to 15d. only the difference from the first embodiment will be described concerning the fourth embodiment shown in FIG. 6. Incidentally, in the module 1 shown in FIG. 6, the bus bar 12a is a cathode, and the bus bar 12b is an anode.

The series-connected array 11 comprises four sub-arrays 13a to 13d that are connected in series. Each of the sub-arrays 13a to 13d comprises four cells 10 connected in series. Also, the diodes 15a to 15d are connected in parallel in the forward direction relative to the power generation direction to the sub-arrays 13a to 13d with terminals 14a to 14d interposed therebetween, respectively. Suppose the cell 10 included in, for example, the sub-array 13b loses the photoelectromotive force so as to increase the resistance in the module 1 of the particular construction. In this case, the photoelectromotive force generated in the other sub-arrays 13a, 13c and 13c is bypassed by the diode 15b, making it possible to suppress the reduction in the output of the module 1 to a minimum level.

Figure 6:
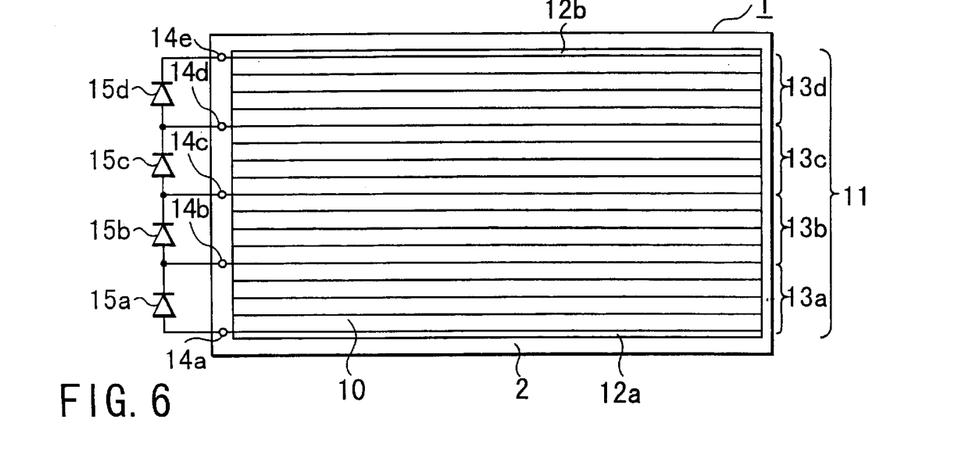
FIG. 6 is a plan view schematically showing a thin film photoelectric conversion module according to a fourth embodiment of the present invention.

It should also be noted that each of the sub-arrays 13a to 13d is formed of an $N_s$ number of cells (four cells 10 in FIG. 6). The number $N_s$ is set to meet the relationship denoted by an inequality $N_s \leq V_a/V_b+1$, where $V_a$ represents the withstand voltage of each cell 10, and $V_b$ represents the open-circuit voltage of each cell under the conditions given below:

Light source: xenon lamp
Irradiance: 100 mW/cm²
A.M.: 1.5
Temperature: 25° C.

In this case, even if the series-connected array 11 is short-circuited, it is possible to prevent the cell 10 from being broken by the hot spot phenomenon by the reasons given below.

For example, where one of the cells 10 included in the sub-array 13b loses the photoelectromotive force so as to cause the photoelectromotive force generated in the sub-arrays 13a, 13c and 13d to be bypassed by the diode 15b, the potentials of the terminals 14b and 14c are made substantially the same. As a result, a reversed bias voltage of $(N_s-1) \times V_c$, where $(N_s-1)$ represents the number of normal cells 10 constituting the sub-array 13b, and Vc represents the photoelectromotive force of the individual normal cells 10, is applied to the cell 10 that has lost the photoelectromotive force. It follows that, if the reversed bias voltage noted above is smaller than the withstand voltage $V_a$ of the cell 10, it is possible to suppress the insulation breakdown of the cell 10 that has lost its electromotive force so as to prevent the cell 10 from being broken.

In general, the photoelectromotive force $V_c$ of the cell 10 is lower than the open-circuit voltage $V_b$ under the conditions given above. Also, the module 1 meets the relationship $(N_s-1) \times V_b \leq V_a$. It follows that, in the module 1 shown in FIG. 6, the cell 10 is prevented from being broken by the hot spot phenomenon.

It is desirable for the number $N_s$, the withstand voltage $V_a$ in the reversed direction, and the open-circuit voltage $V_b$ to meet the relationship denoted by an inequality $V_a/V_b - 1 \leq N_s$. The reduction in the output of the module 1 caused by the loss of the photoelectromotive force of a certain cell 10 can be most effectively suppressed in the case where the number $N_s$ is 1. In this case, however, a large number of diodes 15n are required, leading to cost elevation or to decrease in the effective power generating region. It follows that, where the number $N_s$, the withstand voltage $V_a$, and the open-circuit voltage $V_b$ meet the relationship given above, it is possible to prevent the cell 10 from being broken by the hot spot phenomenon while suppressing the cost elevation and the decrease in the effective power generating region.

In the module 1 shown in FIG. 6, the terminals 14a to 14e can be formed by utilizing the layer forming the cell 10. For example, the terminals 14a to 14e can be formed by forming the metal electrode layer, etc. used in the thin film photoelectric conversion cell 10 to cover not only the power generating region but also the outer region thereof, followed by laser-scribing the outer region of the metal electrode layer. In this case, the diodes 15a to 15d can be mounted to the terminals 14a to 14e by, for example, soldering.

Figure 7:
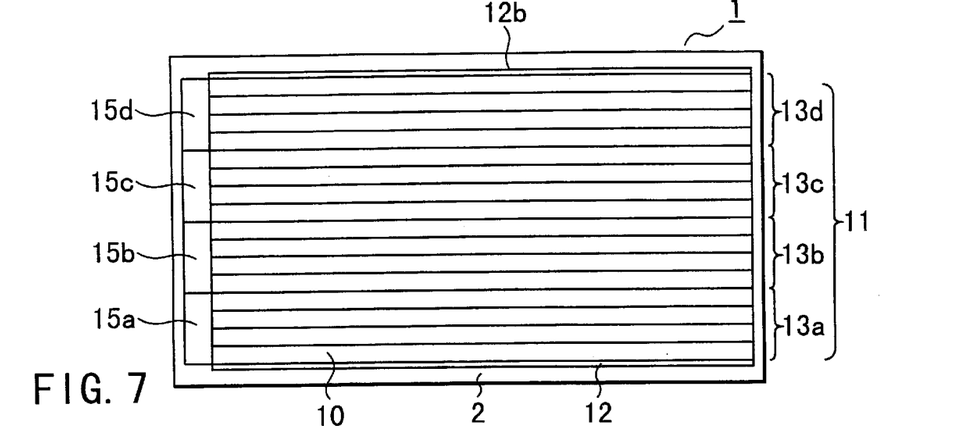
FIG. 7 is a plan view schematically showing a thin film photoelectric conversion module according to a fifth embodiment of the present invention.

A fifth embodiment of the present invention will now be described with reference to FIG. 7, which is a plan view schematically showing a module 7 according to the fifth embodiment. The module 1 shown in FIG. 7 is substantially equal in construction to the module 1 shown in FIG. 6, except that, in the module 1 shown in FIG. 7, the bypass diodes 15a to 15d are formed in the form of a thin film on the substrate, though the bypass diodes 15a to 15d are arranged outside the substrate in the module 1 shown in FIG. 6. Differences from the fourth embodiment alone are described concerning the fifth embodiment.

In the module 1 shown in FIG. 7, the diodes 15a to 15d are substantially equal in the layer structure to the cell 10. In other words, each of these diodes 15a to 15d is of a laminate structure formed on the transparent substrate 2 and consisting of the transparent front surface electrode layer 3, the thin film photoelectric conversion unit 4 and the metal back surface electrode layer 5.

Figure 8:
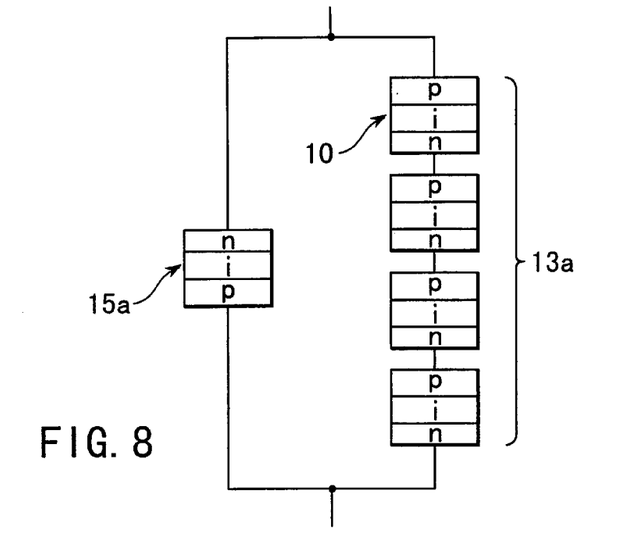
FIG. 8 is a circuit diagram showing the connection between a diode and a sub-array in the thin film photoelectric conversion module shown in FIG. 7.

The connection of the diodes 15a to 15d to the sub-arrays 13a to 13d in the module 1 shown in FIG. 7 will now be described with reference to FIG. 8. Specifically, FIG. 8 shows a circuit diagram showing the connection of the diode 15a to the sub-array 13a in the module 1 shown in FIG. 7. Where the diode 15a is connected in parallel in a forward direction relative to the power generating direction of the sub-array 13a, the diode 15a and the sub-array 13a are opposite to each other in the direction of connection, as shown in FIG. 8. Therefore, when it comes to, for example, the sub-array 13a, the transparent front surface electrode layer 3 of the diode 15a is electrically connected to the bus bar 12a or to the metal back surface electrode layer 5 adjacent to the bus bar 12a. Also, the metal back surface electrode layer 5 of the diode 15a is electrically connected to the transparent front surface electrode layer 3 of the cell 10, which is positioned adjacent to the sub-array 13b, of the sub-array 13a or to the metal back surface electrode layer 5 of the cell 10, which is positioned adjacent to the sub-array 13a, of the sub-array 13b. The particular connection can be easily achieved by properly changing the laser scribing pattern of each layer.

As described above, in the module 1 shown in FIG. 7, each of the diodes 15a to 15d has a construction similar to that of the cell 10. Also, the connection between the diodes 15a to 15d and the cells 10, etc. can be easily achieved by properly changing the laser scribing pattern of each layer. It follows that the module 1 shown in FIG. 7 can be manufactured easily, compared with the module 1 shown in FIG. 6.

In the module shown in FIG. 7, it is desirable to form the diodes 15a to 15d in a peripheral portion of the substrate 2. In general, the module 1 is supported by a frame and, thus, the peripheral portion of the substrate 2 is not utilized for the power generation. It should be noted that the diodes 15a to 15d need not be irradiated with light. In addition, it suffices for the diodes 15a to 15d to have a relatively small area. It follows that the surface of the substrate 2 can be effectively utilized by forming the diodes 15a to 15d in a peripheral region of the substrate 2.

In the fourth and fifth embodiments described above, the diodes 15a to 15d are arranged in one edge portion of the substrate 2. However, these diodes can be arranged otherwise. For example, the diodes 15a to 15d can be alternately arranged on both edge portions of the substrate 2. Also, in each of the fourth and fifth embodiments, a single diode 15 is arranged for a single sub-array 13. Alternatively, a plurality of diodes may be arranged for a single sub-array. Further, in each of the fourth and fifth embodiments, the series-connected array 11 consists of four sub-arrays 13. However, it is also possible to employ another construction.

A sixth embodiment of the present invention will now be described with reference to FIG. 9, which is a cross sectional view schematically showing a module 1 according to the sixth embodiment. The module 1 shown in FIG. 9, which is substantially equal in construction to the module of the first embodiment shown in FIGS. 1 and 2, differs from the module shown in FIGS. 1 and 2 in that a transparent oxide layer 6 is interposed between the thin film photoelectric conversion unit 4 and the metal back surface electrode layer 5, and a metal portion 8 is included in the module shown in FIG. 9. Only the differences from the first embodiment will be described concerning the sixth embodiment.

Figure 9:
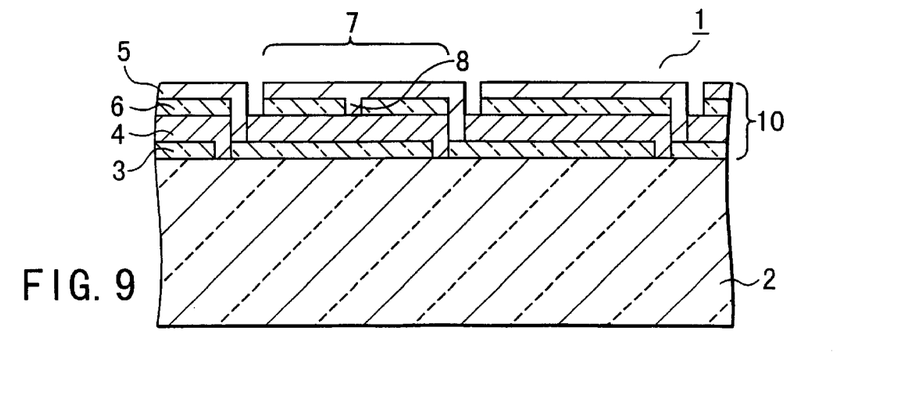
FIG. 9 is a cross sectional view showing a thin film photoelectric conversion module according to a sixth embodiment of the present invention.

In the module 1 shown in FIG. 9, the transparent oxide layer 6 has a hole or a groove formed in region 7, said hole or groove having the bottom surface constituted by the upper surface of the thin film photoelectric conversion unit 4. Also, a metal portion 8 made of a material constituting the metal back surface electrode layer 5 is formed in the hole or the groove. In other words, in the module 1 shown in FIG. 9, the hole or groove is filled with the material constituting the metal back surface electrode layer 5. Incidentally, the region 7 is sandwiched between the transparent front surface electrode layer 3 and the metal back surface electrode layer 5 and corresponds to a region to which an effective voltage is applied or applying a reversed bias voltage to the cell 10.

Figure 10:
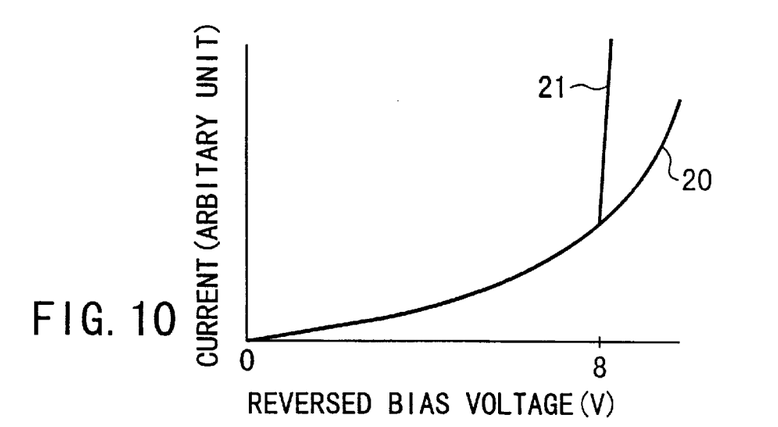
FIG. 10 is a graph showing the electrical characteristics of the thin film photoelectric conversion module according to the sixth embodiment of the present invention.

FIG. 10 is a graph showing the electrical characteristics of the cell 10 included in the module 1 shown in FIG. 9. In the graph of FIG. 10, the reversed bias voltage applied to the cell 10 is plotted on the abscissa. Also, the current flowing through the cell 10 immediately after application of the reversed bias voltage is plotted on the ordinate. Curve 20 shown in the graph covers the case where the metal portion 8 is not arranged, with curve 21 covering the case where the metal portion 8 is arranged.

In the module that does not include the metal portion, the current flowing through the cell immediately after application of the reversed bias voltage is small even if the applied reversed bias voltage exceeds a predetermined value, e.g., 8V, as denoted by curve 20. This is because that in the case where the metal portion 8 is not arranged, the short-circuiting between the metal back surface electrode layer and the transparent front surface electrode layer does not take place promptly, since the cell must be heated to or higher than a temperature at which the transparent oxide layer is melted in order to bring about short-circuiting between the metal back surface electrode layer and the transparent front surface electrode layer.

On the other hand, where the metal portion 8 is arranged in the module 1, a very large current flows through the cell 10 immediately after the voltage application, if a predetermined reversed bias voltage, e.g., 8V, is applied to the cell 10, as denoted by curve 21. In the case of arranging the metal portion 8, the transparent oxide layer 6 need not be melted for bringing about short-circuiting between the metal back surface electrode layer 5 and the transparent front surface electrode layer 3. It follows that the short-circuiting between them is brought about immediately after applying a predetermined reversed bias voltage.

As described above, in the module 1 shown in FIG. 9, the short-circuiting between the metal portion 8 and the transparent front surface electrode layer 3 is not obstructed by the transparent oxide layer 6 when a predetermined reversed bias voltage is applied to the cell 10. Therefore, short-circuiting can be brought about immediately between the metal back surface electrode layer 5 and the transparent front surface electrode layer 3. In other words, when the light to one of the cells 10 is intercepted, the light-intercepted cell 10 is prevented from being heated excessively, leading to a high reliability of the module 1.

It is desirable for the short-circuiting to be brought about when a reversed bias voltage of at least 8V is applied to the cell 10. In the manufacture of the module 1, it is possible for a reversed bias voltage to be applied to the cell 10 in an attempt to repair the defective portion of the cell 10. In general, such a reversed bias treatment is carried out under voltage lower than 8V. Therefore, an undesired short-circuiting during the reversed bias treatment can be prevented by designing the module such that the short-circuiting takes place when a reversed bias voltage of at least 8V is applied to the module.

Also, the module 1 shown in FIG. 9 is designed in general such that the short-circuiting takes place immediately after application of a reversed bias voltage not higher than 10V to the module 1. In this case, the cell 10 is prevented from being heated to 200° C. or more.

The magnitude of the reversed bias voltage that can bring about the short-circuiting in question can be controlled by the size, number, etc. of the metal portions 8. Preferably, 1 to 3 metal portions 8 are arranged in a single cell 10. Also, the contact area between the metal portion 8 and the thin film photoelectric conversion unit 4 is designed to occupy preferably 0.1% to 10%, more preferably about 1%, of that portion of one surface of the thin film photoelectric conversion unit 4 which is positioned within region 7.

In the embodiment shown in FIG. 9, the metal portion 8 and the metal back surface electrode layer 5 are made of the same material. Therefore, the metal portion 8 and the metal back surface electrode layer 5 can be formed simultaneously by forming the metal back surface electrode layer 5 after formation of a hole or groove corresponding to the metal portion 8 in the transparent oxide layer 6 by, for example, a laser scribing.

A seventh embodiment of the present invention will now be described with reference to FIG. 11, which is a cross sectional view schematically showing the module 1 according to the seventh embodiment of the present invention. The module 1 of the seventh embodiment, which is substantially equal in construction to the module 1 of the sixth embodiment shown in FIG. 9, differs from the module 1 of the sixth embodiment in that the metal portion 8 is formed on the transparent front surface electrode layer 3. Only the differences from the sixth embodiment will be described concerning the seventh embodiment.

Figure 11:
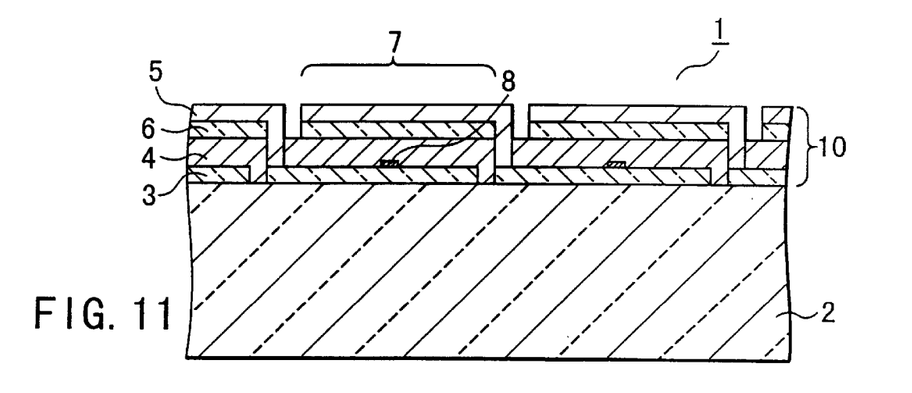
FIG. 11 is a cross sectional view schematically showing a thin film photoelectric conversion module according to a seventh embodiment of the present invention.

The module 1 shown in FIG. 11 is equal to that shown in FIG. 9 in that the short-circuiting between the metal portion 8 and the metal back surface electrode layer 5 is not obstructed by the transparent oxide layer 6 when a predetermined reversed bias voltage is applied to the cell 10. Therefore, short-circuiting between the metal back surface electrode layer 5 and the transparent front surface electrode 3 can be brought about promptly. In other words, when the light to one of the cells 10 is intercepted, the light-intercepted cell 10 is prevented from being heated excessively.

In the embodiment shown in FIG. 11, the metal portion 8 and the metal back surface electrode layer 5 are formed as separate members of the module 1. Naturally, the metal portion 8 and the metal back surface electrode layer 5 can be made of materials differing from each other. The metal portion 8 is made of, for example, silver or aluminum.

In a case where vanadium or chromium is used for forming the metal portion 8, even if short-circuiting is generated between the metal back surface electrode layer 5 and the transparent front surface electrode layer 3 of a certain cell 10, the metal back surface electrode layer 5 can be insulated again from the transparent front surface electrode layer 3 by applying a forward voltage to the cell 10. In other words, the cell 10, even if broken down, can be repaired easily.

In the module 1 of each of the sixth embodiment and the seventh embodiment, the metal portion 8 is in direct contact with the thin film photoelectric conversion unit 4. However, it is not absolutely necessary for the metal portion 8 to be brought into direct contact with the thin film photoelectric conversion unit 4. For example, where a conductive thin film having a melting point higher than that of the metal portion 8 is interposed between the metal portion 8 and the thin film photoelectric conversion unit 4, i.e., where the metal portion 8 is brought into indirect contact with the thin film photoelectric conversion unit 4 with the conductive thin film interposed therebetween, it is possible to obtain the particular effect described above as far as the melting point of the conductive thin film is not higher than that of the transparent oxide layer 6 and the thickness of the conductive thin film is not larger than 50% of the thickness of the transparent oxide film 6, though the effect obtained is not so prominent as in the case of bringing the metal portion 8 into direct contact with the thin film photoelectric conversion unit 4.

As described above, according to the first to seventh embodiments of the present invention, measures are taken to suppress the behavior of the cell as a diode, to prevent a large current from flowing through the cell having the light thereto intercepted, or to facilitate the short-circuiting in the cell having the light thereto intercepted. As a result, when the light to one of the cells is intercepted, the light-intercepted cell is prevented from being heated to an excessively high temperature. In other words, the first to seventh embodiments of the present invention permit improving the reliability of the thin film photoelectric conversion module.

In the first to seventh embodiments described above, a laminate structure consisting of the transparent electrode layer 3, the thin film photoelectric conversion unit 4 having a p-i-n junction, and the metal electrode layer 5 is formed on the transparent substrate 2 such that the transparent electrode layer 3 is in direct contact with the transparent substrate 2. Of course, the module of the present invention may be of another structure. For example, a laminate structure consisting of a metal electrode layer, a thin film photoelectric conversion unit having an n-i-p junction and a transparent electrode layer may be formed on a substrate such that the metal electrode layer is in direct contact with the substrate. It is also possible for the thin film photoelectric conversion unit 4 to be of a tandem type.

Some Examples of the present invention will now be described together with Comparative Examples.

EXAMPLE 1

A thin film photoelectric conversion module as shown in FIGS. 1 and 2 was prepared as follows. In the first step, an $SnO_2$ film 3 formed on one surface of the glass substrate 2 was scribed by laser scanning in parallel to the longer side of the substrate 1 by using a YAG laser so as to divide the $SnO_2$ film 3 into a plurality band-like patterns.

Then, a p-type hydrogen-containing amorphous silicon carbide layer 41 having a thickness of 10 nm, an i-type hydrogen-containing amorphous silicon layer 42 having a thickness of 300 nm and an n-type hydrogen-containing microcrystalline silicon layer 43 having a thickness of 10 nm were successively formed by a plasma CVD method on the SnO$_2$ film 3. The p-type hydrogen-containing silicon carbide layer 41 was doped with an impurity of boron. The i-type hydrogen-containing amorphous silicon layer was not doped with an impurity. Further, the n-type hydrogen-containing microcrystalline silicon layer 43 was doped with phosphorus. In this fashion, the thin film photoelectric conversion unit 4 having a p-i-n junction was formed.

The thin film photoelectric conversion unit 4 was scribed by laser scanning in parallel to the longer side of the substrate 1 by using a YAG laser so as to divide the thin film photoelectric conversion unit 4 into a plurality of band-like patterns.

Further, a back surface electrode layer was formed by successively forming a ZnO film (not shown) having a thickness of 100 nm and a Ag film 5 having a thickness of 300 nm on the thin film photoelectric conversion unit 4 by a sputtering method. The back surface electrode layer was also subjected to a laser-scribing by using a YAG laser so as to divide the back surface electrode layer into a plurality of band-like patterns.

As a result, formed was a series-connected array 11 consisting of 50 thin film photoelectric conversion cells 10 each sized at 10 mm×800 mm, which were connected in series in a vertical direction, i.e., in a direction parallel to the shorter side of the substrate 2.

A pair of electrode bus bars 12 were mounted to both edge portions of the series-connected array 11, followed by bringing a pair of conductor portions connected to a power source into contact with the Ag films 5 of the adjacent thin film photoelectric conversion cells 10 so as to apply voltage for 3 seconds in the direction of the power generation of the cell 10. Incidentally, the conductor portion noted above was shaped to conform with the thin film photoelectric conversion cell 10. Also, the voltage applied to the cell 10 was what was obtained by superposing an AC voltage of 60 Hz on a DC voltage and, thus, the applied voltage was periodically changed within a range of between 0V and 9V. The module 1 shown in FIGS. 1 and 2 was obtained by applying the particular reversed bias treatment to all the cells 10.

Ten modules 1 were prepared by the method described above, and the output characteristics of these modules were examined by a solar simulator with an irradiance of 100 mW/cm$^2$ using a xenon lamp as a light source and an air mass (A.M.) of 1.5. The measuring temperature was set at 25° C. As a result, the open-circuit voltage of the series-connected array 11 was found to be 42.5V, the short circuit current was found to be 1 A, and F.F. was found to be 70%.

Also, the open-circuit voltage of the thin film photoelectric conversion cells 10 under the conditions given above was 0.85V on the average, and each of the thin film photoelectric conversion cells 10 was capable of permitting current of the magnitude equal to the short-circuit current of the series-connected array 11 under the conditions given above to flow in a direction equal to the power generating direction upon application of a reversed bias voltage of 8V.

Then, each of these modules 1 was short-circuited and left to stand under the light irradiating conditions given above. In the light irradiating step, the light to one of the cells 10 was intercepted to make zero the photoelectromotive force of the light-intercepted cell. One minute later, each module 1 was inspected to see whether or not the cell 10 was broken. Breakage of the cell 10 was not recognized in any of all the modules 1. Also, the cell 10 having the light thereto intercepted was not heated excessively and the temperature thereof was not elevated to 200° C.

COMPARATIVE EXAMPLE 1

Ten modules were prepared as in Example 1, except that the reversed bias treatment was not performed. The output characteristics of these modules were also examined under the conditions equal to those employed in Example 1. The open-circuit voltage of the series-connected array was found to be 42.5V, the short-circuit current was found to be 1 A, and F.F. was found to be 70%. Also, the open-circuit voltage of the thin film photoelectric conversion cell under the conditions given above was found to be 0.85V.

Then, each of these modules 1 was short-circuited and left to stand under the light irradiating conditions given above. In the light irradiating step, the light to one of the cells 10 was intercepted to make zero the photoelectromotive force of the light-intercepted cell. One minute later, each module 1 was inspected to see whether or not the cell 10 was broken. The cell 10 was found to have been broken in any all the modules 1. Also, the cell 10 having the light thereto intercepted was excessively heated to cause the temperature thereof to far exceed 200° C.

EXAMPLE 2

The thin film photoelectric conversion module 1 constructed as shown in FIG. 4 was prepared as follows. Incidentally, the construction in cross section of the thin film photoelectric conversion module 1 shown in FIG. 4 is substantially equal to that of the module 1 shown in FIG. 1. Therefore, FIGS. 2 and 4 will be referred to in the following description of this Example.

In the first step, an SnO$_2$ film 3 formed on one main surface of the glass substrate 2 was scribed by the method similar to that employed in Example 1 to divide the SnO$_2$ film 3 into a plurality of band-like patterns, followed by forming a thin film photoelectric conversion unit 4. Then, the thin film photoelectric conversion unit 4 was scribed by laser scanning in a direction parallel to the longer side of the substrate 1 by using a YAG laser so as to divide the thin film photoelectric conversion unit 4 into a plurality of band-like patterns.

In the next step, a back surface electrode layer was formed by successively forming by a sputtering method a ZnO film (not shown) having a thickness of 90 nm and an Ag film 5 having a thickness of 300 nm on the thin film photoelectric conversion unit 4. The back surface electrode layer was also subjected to a laser scribing by using a YAG laser so as to divide the back surface electrode layer into a plurality of band-like patterns.

In the next step, a laser scribing using a YAG laser was applied in a direction parallel to the shorter side of the substrate 2 so as to divide the SnO$_2$ film 3, the thin film photoelectric conversion unit 4 and the back surface electrode layer along the longer side of the substrate 2. As a result, formed were 4 series-connected arrays 11 each consisting of 50 thin film photoelectric conversion cells 10 each sized at 10 mm×200 mm and connected in series in the vertical direction (i.e., in a direction parallel to the shorter side of the substrate 2).

Further, a pair of electrode bus bars 12 were mounted to the substrate 2 to connect these series-connected arrays 11 in parallel. Still further, Tedler (trade name of a fluorocarbon resin-series sheet, not shown) was laminated on that surface of the substrate 2 on which the series-connected arrays 11 were formed, with an EVA layer (not shown) interposed between the series-connected arrays 11 and the fluorocarbon resin-series sheet, so as to obtain the module 1.

Ten modules 1 were prepared by the method described above, and the output characteristics of these modules were examined under the conditions similar to those in Example 1. As a result, the open-circuit voltage of the series-connected array 11 was found to be 44V, the short circuit current was found to be 250 mA.

Then, each of these modules 1 was short-circuited and left to stand under the light irradiating conditions given above. In the light irradiating step, the light to one of the cells 10 was intercepted to make zero the photoelectromotive force of the light-intercepted cell. One minute later, each module 1 was inspected to see whether or not the cell 10 was broken. Breakage of the cell 10 was not recognized in any of all the modules 1. Also, the cell 10 having the light thereto intercepted was not heated excessively and the temperature thereof was not elevated to 200° C.

COMPARATIVE EXAMPLE 2

Ten thin film photoelectric conversion modules were prepared as in Example 2, except that a laser-scribing in a direction parallel to the shorter side of the substrate was not applied and a single series-connected array, in which 50 thin film photoelectric conversion cells each sized at 10 mm×800 mm were connected in series in the vertical direction, was formed.

The output characteristics of these modules were also examined under the conditions equal to those in Example 2. The open-circuit voltage of the module was found to be 44V, and the short-circuit current was found to be 1 A.

Then, each of these modules 1 was short-circuited and left to stand under the light irradiating conditions given above. In the light irradiating step, the light to one of the cells 10 was intercepted. One minute later, each module 1 was inspected to see whether or not the cell 10 was broken. The cell 10 was found to have been broken in any all the 10 modules 1. Also, the cell 10 having the light thereto intercepted was excessively heated to cause the temperature thereof to far exceed 200° C.

EXAMPLE 3

The thin film photoelectric conversion module 1 constructed as shown in FIG. 7 was prepared as follows. Incidentally, the construction in cross section of the thin film photoelectric conversion module 1 shown in FIG. 7 is substantially equal to that of the module 1 shown in FIG. 1. Therefore, FIGS. 2 and 7 will be referred to in the following description of this Example.

In the first step, an $SnO_2$ film 3 formed on one main surface of the glass substrate 2 was patterned to conform with the cells 10 and the diodes 15 by a laser-scribing using a YAG laser.

Then, formed successively by a plasma CVD method on the $SnO_2$ film 3 were a p-type hydrogen-containing amorphous silicon carbide layer 41 having a thickness of 10 nm, an i-type hydrogen-containing amorphous silicon layer 42 having a thickness of 300 nm, and an n-type hydrogen-containing microcrystalline silicon layer 43 having a thickness of 10 nm. The p-type hydrogen-containing amorphous silicon carbide layer 41 was doped with boron acting as a p-type impurity. The i-type hydrogen-containing amorphous silicon layer 42 was not doped with an impurity. Further, the n-type hydrogen-containing microcrystalline silicon layer 43 was doped with phosphorus. In this fashion, a thin film photoelectric conversion unit 4 having a p-i-n junction was prepared.

Then, the thin film photoelectric conversion unit 4 was patterned to conform with the cells 10 and the diodes 15 by applying a laser-scribing using a YAG laser.

In the next step, a back surface electrode layer was formed by successively forming by a sputtering method a ZnO film (not shown) having a thickness of 100 nm and an Ag film 5 having a thickness of 300 nm on the thin film photoelectric conversion unit 4. The back surface electrode layer was also subjected to a laser scribing by using a YAG laser.

In the next step, the $SnO_2$ film 3, the thin film photoelectric conversion unit 4 and the back surface electrode layer were subjected to a laser scribing by using a YAG laser so as to insulate the power generating region from the peripheral region of the substrate. As a result, formed were the series-connected array 11 consisting of 45 thin film photoelectric conversion cells 10 each sized at 10 mm×900 mm and connected in series in the vertical direction, i.e., in a direction parallel to the shorter side of the substrate 2, and 5 diodes 15 each sized at 90 mm×2 mm. Incidentally, these 5 diodes 15 were respectively connected in parallel to 5 groups of cells 10, each group consisting of 9 cells connected in series, in a forward direction relative to the power generation direction.

Further, a pair of electrode bus bars 12a and 12b were mounted to both edge portions of the series-connected array 11. Still further, Tedler (trade name of a fluorocarbon resin-series sheet, not shown) was laminated on that surface of the substrate 2 on which the series-connected arrays 11 were formed, with an EVA layer (not shown) interposed between the series-connected arrays 11 and the fluorocarbon resin-series sheet, so as to obtain the module 1.

Ten modules 1 were prepared by the method described above, and the output characteristics of these modules were examined under the conditions similar to those in Example 1. As a result, the open-circuit voltage of the series-connected array 11 was found to be 40V, and the short circuit current was found to be 1.3 A. Also, the withstand voltage of each cell 10 of these modules 1 was measured before lamination of the EVA layer and the fluorocarbon-series sheet. The withstand voltage was found to be 8V on the average.

Then, each of these modules 1 was short-circuited and left to stand under the light irradiating conditions given above. In the light irradiating step, the light to one of the cells 10 was intercepted by attaching a black vinyl tape to the light-receiving surface of the cell 10 to make zero the photoelectromotive force of the light-intercepted cell. One minute later, each module 1 was inspected to see whether or not the cell 10 was broken. Breakage of the cell 10 was not recognized in any of all the modules 1. Also, the cell 10 having the light thereto intercepted was not heated excessively and the temperature thereof was not elevated to 200° C.

COMPARATIVE EXAMPLE 3

Ten thin film photoelectric conversion modules were prepared as in Example 3, except that the series-connected array consisting of 45 thin film photoelectric conversion cells each sized at 10 mm×900 mm and connected in series in the vertical direction was formed without forming the diodes 15.

The output characteristics of these modules were also examined under the conditions equal to those in Example 3. The open-circuit voltage of the module was found to be 40V and the short-circuit current was found to be 1.3 A. Also, the withstand voltage in the reverse direction of each cell was found to be 8V on the average.

Then, each of these modules was short-circuited and left to stand under the light irradiating conditions given above. In the light irradiating step, the light to one of the cells was intercepted by attaching a black vinyl tape to the light-receiving surface of the cell 10 to make zero the photoelectromotive force of the light-intercepted cell. One minute later, each module was inspected to see whether or not the cell was broken. Breakage of the cell was recognized any of all the modules. Also, the cell having the light thereto intercepted was heated to far exceed 200° C.

EXAMPLE 4

Figure 12:
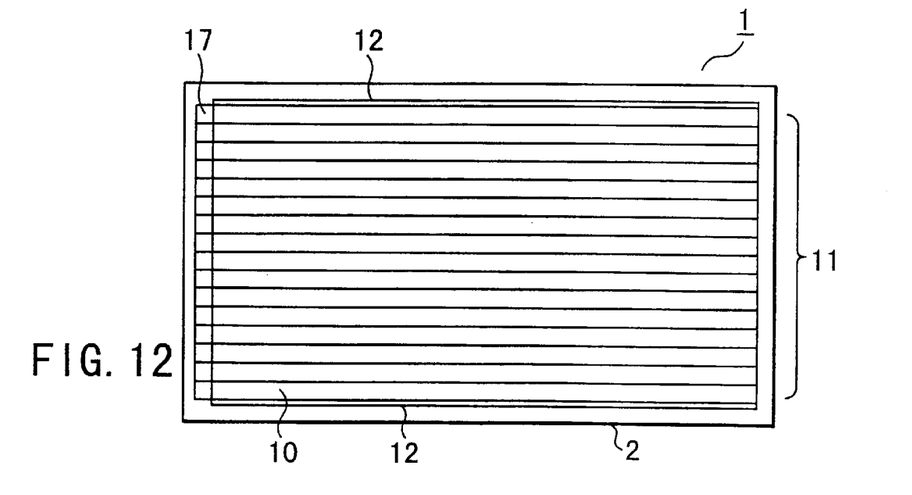
FIG. 12 is a plan view schematically showing a thin film photoelectric conversion module prepared in Example 4 of the present invention.

FIG. 12 is a plan view schematically showing a thin film photoelectric conversion module 1 prepared in this Example. The module 1 shown in FIG. 12 was substantially equal in construction to the module 1 shown in FIG. 9, except the shape of the metal portion 8. Therefore, FIGS. 9 and 12 will be referred to in describing the method of manufacturing the module 1 shown in FIG. 12.

In the first step, an $SnO_2$ film 3 formed on one main surface of the glass substrate 2 was subjected to a laser scanning by using a YAG laser in a direction parallel to the longer side of the substrate 1 so as to divide the $SnO_2$ film 3 into a plurality of band-like patterns.

Then, formed successively on the $SnO_2$ film 3 by a plasma CVD method were a p-type hydrogen-containing amorphous silicon carbide layer having a thickness of 10 nm, an i-type hydrogen containing amorphous silicon layer having a thickness of 300 nm, and an n-type hydrogen-containing microcrystalline silicon layer having a thickness of 10 nm. Incidentally, the p-type hydrogen-containing amorphous silicon carbide layer was doped with an impurity of boron. The i-type hydrogen-containing amorphous silicon layer was not doped with an impurity. Further, the n-type hydrogen-containing microcrystalline silicon layer was doped with phosphorus. In this fashion, obtained was a thin film photoelectric conversion unit 4 having a p-i-n junction.

Then, the thin film photoelectric conversion unit 4 was scribed by applying a laser scanning using a YAG laser in a direction parallel to the longer side of the substrate 1 so as to divide the thin film photoelectric conversion unit 4 into a plurality of band-like patterns.

Further, a ZnO film 5 having a thickness of 100 nm was formed by a sputtering method on the thin film photoelectric conversion unit 4. In forming the ZnO film 5, a mask was used such that the ZnO film 5 was not formed in a peripheral region, 2 mm wide, at one edge of the plural band-like patterns. In other words, the ZnO film 5 was formed to provide a non-film forming region 17 sized at 10 mm×2 mm at one edge of the plural band-like patterns.

Further, a Ag film 6 was formed by a sputtering method in a thickness of 300 nm on the ZnO film 5 and the non-film forming region 17. In this Example, the Ag film 6 formed on the non-film forming region 17 performs the function of the metal portion 8. These ZnO film 5 and the Ag film 6 were also subjected to a laser scribing by using a YAG laser so as to be divided into a plurality of band-like patterns.

In this fashion, prepared was a series-connected array 11 consisting of 50 thin film photoelectric conversion cells 10 each sized at 10 mm×800 mm and connected in series in the vertical direction (i.e., in a direction parallel to the shorter side of the substrate 2. In this series-connected array 11, a single metal portion 8 is arranged in each cell 10. Also, the area of the region 7 shown in FIG. 9 was 76 cm².

Finally, a pair of electrode bus bars 12 were mounted to both edges of the series-connected array 11 so as to obtain the module 1 shown in FIG. 12.

Ten modules 1 were prepared by the method described above, and the output characteristics of these modules were examined under the conditions equal to those in Example 1. The open-circuit voltage of the series-connected array 11 was found to be 43V, and the short-circuit current was found to be 1 A.

Then, each of these modules 1 was short-circuited to observe the changes in the output current under the illuminating conditions given above. In the illuminating step, the light to one of the cells 10 was intercepted so as to make zero the photoelectromotive force of the light-intercepted cell. In other words, a reversed bias voltage of 42V was applied to the light-intercepted cell 10.

The time from the initiation of the light irradiation to the point at which the output current was markedly increased was measured on the basis that the $SnO_2$ film 3 and the Ag film 6 were short-circuited when the output current was markedly increased. The output current of the module 1 was found to have reached 1 A immediately after initiation of the light irradiation and to have remained constant thereafter. The light-intercepted cell was not heated excessively, and the temperature thereof did not reach 200° C.

COMPARATIVE EXAMPLE 4

Ten modules were prepared as in Example 4, except that the module did not include the metal portion 8. To be more specific, 10 modules were prepared as in Example 4, except that the ZnO film was formed without forming the non-film forming region 17 for the metal portion 8.

The output characteristics of these modules were examined under the conditions equal to those in Example 4. The open-circuit voltage of the series-connected array was found to be 43V, and the short-circuit current was found to be 1 A.

Then, each of these modules was short-circuited to observe the changes in the output current under the illuminating conditions given above. In the illuminating step, the light to one of the cells was intercepted so as to make zero the photoelectromotive force of the light-intercepted cell. In other words, a reversed bias voltage of 42V was applied to the light-intercepted cell.

The time from the initiation of the light irradiation to the point at which the output current was markedly increased was measured on the basis that the $SnO_2$ film 3 and the Ag film 6 were short-circuited when the output current was markedly increased. The output current of the module was found to have rapidly increased one second after initiation of the light irradiation, finally reaching 1 A. Also, the light-intercepted cell was heated excessively to cause the temperature thereof far to exceed 200° C.

As described above, a measure is taken in the present invention to suppress the behavior of the cell as a diode, to prevent a large current from flowing through the light-intercepted cell, or to facilitate the short-circuiting in the light-intercepted cell. As a result, even where the light to one of the cells is intercepted, the particular cell is prevented from being heated to an excessively high temperature. In other words, the present invention provides a thin film photoelectric conversion module having a high reliability and a method of manufacturing the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A thin film photoelectric conversion module, comprising:
   a substrate; and
   a series-connected array including a plurality of thin film photoelectric conversion cells formed on the substrate and connected to each other in series, the number of cells being represented by N, an open-circuit voltage of each of the cells being represented by E, and N being an integer of at least 10,
   wherein a current equal to a short-circuit current of each of the cells under conditions that a xenon lamp is used as a light source, an irradiance is 100 mW/cm², air mass is 1.5, and temperature is 25° C., is allowed to flow through each of the cells by application of a reversed bias voltage not higher than (N−1)×E.

2. The module according to claim 1, wherein said reversed bias voltage is not higher than 8V.

3. A thin film photoelectric conversion module, comprising:
   a substrate;
   a plurality of series-connected arrays each including a plurality of thin film photoelectric conversion cells formed on said substrate and connected to each other in series; and
   a pair of common electrodes for connecting said plural series-connected arrays in parallel,
   wherein a short-circuit current of said module is not lower than 1 A under conditions that a xenon lamp is used as a light source, irradiance is 100 mW/cm², air mass is 1.5, and temperature is 25° C., and a short-circuit current of each of said plural series-connected arrays is not higher than 600 mA under the conditions.

4. The module according to claim 3, wherein said cells are arranged in both vertical and lateral directions to form a lattice-shaped arrangement.

5. The module according to claim 4, wherein said cells positioned adjacent to each other in the vertical direction are connected to each other in series to form said plural series-connected arrays, and said pair of common electrodes are arranged at both edge portions in the vertical direction of the lattice-shaped cell arrangement.

6. The module according to claim 3, wherein the short-circuit current of each of said plural series-connected arrays is not lower than 300 mA under said conditions.

7. A thin film photoelectric conversion module, comprising:
   a substrate;
   a plurality of sub-arrays each having a plurality of thin film photoelectric conversion cells formed on the substrate and connected in series, the number of cells constituting each of the plural sub-arrays being represented by $N_s$ and said plural sub-arrays being connected in series to form a series-connected array; and
   a plurality of bypass diodes connected in parallel to the plural sub-arrays, respectively,
   wherein the number $N_s$, a withstand voltage $V_a$ of each of the cells, and an open-circuit voltage $V_b$ of each of the cells under conditions that a xenon lamp is used as the light source, irradiance is 100 mw/cm², air mass is 1.5, and temperature is 25° C., meet an inequality $N_s \leq V_a/V_b + 1$.

8. The module according to claim 7, wherein each of the bypass diodes is a thin film formed on the substrate.

9. The module according to claim 7, wherein each of the bypass diodes is substantially equal in layer construction to each of the cells.

10. The module according to claim 7, wherein the number $N_s$, the withstand voltage $V_a$, and the open-circuit voltage $V_b$ meet an inequality $V_a/V_b - 1 \leq N_s$.

11. A thin film photoelectric conversion module, comprising:
    a substrate; and
    a plurality of thin film photoelectric conversion cells formed on the substrate and connected in series, wherein each of said cells comprises a transparent front surface electrode layer, a thin film photoelectric conversion unit provided on the transparent front surface electrode, a conductive transparent oxide layer provided on said unit, a metal back surface electrode layer provided on said transparent oxide layer, and a metal portion that is partly brought into contact with said unit in a region sandwiched between the transparent front surface electrode layer and the metal back surface electrode layer without electrically connecting the transparent front surface electrode layer with the metal back surface electrode layer.

12. The module according to claim 11, wherein a contact area between said unit and said metal portion is 0.5 to 10% of a surface area of said unit in the region sandwiched between the transparent front surface electrode layer and the metal back surface electrode layer.

13. The module according to claim 11, wherein said metal portion is mounted in contact with the back surface of said unit in a manner to communicate with both the unit and said metal back surface electrode layer.

14. The module according to claim 13, wherein said metal portion and said metal back surface electrode layer are identical in material.

15. A method of manufacturing a thin film photoelectric conversion module including a substrate and a plurality of thin film photoelectric conversion cells formed on the substrate and connected to each other in forward direction, comprising the step of repeatedly applying a reversed bias voltage to each of the cells so as to increase the magnitude of the current flowing through the cells on applying the reversed bias voltage.

16. The method according to claim 15, wherein said cells are connected to each other in series to form a series-connected array.

17. A method of manufacturing a thin film photoelectric conversion module including a substrate and a plurality of thin film photoelectric conversion cells formed on the substrate and connected to each other in series to form a series-connected array, comprising the step of repeatedly applying a reversed bias voltage to each of the cells so as to increase the magnitude of the current flowing through the cells on applying the reversed bias voltage, wherein the step of repeatedly applying the reversed bias voltage is continued until a current flowing through each of the cells by applying a reversed bias voltage of (N−1)×E reaches or exceeds a short-circuit current of said series-connected array under conditions that xenon lamp is used as a light source, irradiant is 100 mW/cm², air mass is 1.5, and temperature is 25° C., N representing the number of the cells constituting said series-connected array and being an integer of at least 10, and E representing an open-circuit voltage of each of the cells under the conditions.

18. The method according to claim 17, wherein the reversed bias voltage repeatedly applied to each of said cells is 8V to 9V.

19. The method according to claim 15, wherein said reversed bias voltage is repeatedly applied by utilizing an AC voltage.

20. A method of manufacturing a thin film photoelectric conversion module including a substrate and a plurality of thin film photoelectric conversion cells formed on the substrate and connected to each other in series to form a series-connected array, comprising the step of repeatedly applying a reversed bias voltage to each of the cells so as to increase the magnitude of the current flowing through the cells on applying the reversed bias voltage, wherein the step of repeatedly applying the reversed bias voltage is continued until a current flowing through each of the cells by applying a reversed bias voltage of 8V reaches or exceeds a short-circuit current of said series-connected array under conditions that a xenon lamp is used as light source, irradiant is 100 mW/cm$^2$, air mass is 1.5, and temperature is 25° C.

* * * * *